US012808959B2

(12) United States Patent
Maccabe et al.

(10) Patent No.: US 12,808,959 B2
(45) Date of Patent: Nov. 24, 2026

(54) INTEGRATED ELECTROMAGNETIC CONTROL AND SHIELDING OF SOLID-STATE SPIN ENSEMBLES

(71) Applicant: Massachusetts Institute of Technology, Cambridge, MA (US)

(72) Inventors: Andrew Cannon Maccabe, Milford, NH (US); Jennifer Schloss, Acton, MA (US); John F. Barry, Arlington, MA (US); Danielle A. Braje, Winchester, MA (US); Muhammet Adnan Zaloglu, Bedford, NH (US); Jessica Kedziora, Shirley, MA (US); Adam Alexander Libson, Newton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 254 days.

(21) Appl. No.: 18/417,346

(22) Filed: Jan. 19, 2024

(65) Prior Publication Data

US 2025/0334655 A1 Oct. 30, 2025

Related U.S. Application Data

(60) Provisional application No. 63/480,630, filed on Jan. 19, 2023.

(51) Int. Cl.
*G01R 33/26* (2006.01)
*G01R 33/12* (2006.01)
(Continued)

(52) U.S. Cl.
CPC ....... *G01R 33/323* (2013.01); *G01R 33/1284* (2013.01); *G01R 33/26* (2013.01); *H01P 3/081* (2013.01); *H10N 50/20* (2023.02)

(58) Field of Classification Search
CPC .. G01R 33/323; G01R 33/1284; G01R 33/26; G01R 33/3876; G01R 33/3856; G01R 33/3872; H10N 50/20; H01P 3/081
(Continued)

(56) References Cited

U.S. PATENT DOCUMENTS

| | | | | |
|---|---|---|---|---|
| 8,947,080 B2 * | 2/2015 | Lukin | G01N 24/10 324/345 |
| 9,245,551 B2 * | 1/2016 | El Hallak | G11B 5/455 |

(Continued)

OTHER PUBLICATIONS

Bayat et al. "Efficient, uniform, and large area microwave magnetic coupling to NV centers in diamond using double split-ring resonators." Nano Letters 14.3 (2014): 1208-1213.

(Continued)

*Primary Examiner* — Lee E Rodak
*Assistant Examiner* — Taqi R Nasir
(74) *Attorney, Agent, or Firm* — Smith Baluch LLP

(57) ABSTRACT

Quantum technology possesses broad applicability across emerging quantum sensing and quantum computing markets. Described herein is a passive device integrating a solid-state spin ensemble, electromagnetic transmission lines, electromagnetic interference shielding, and a heat spreader for robust quantum state control over a wide range of temperatures and electromagnetic frequencies. Quantum state control is carried out by integrating the solid-state spin ensemble into the non-resonant electromagnetic transmission line network and applying one or more time-varying electromagnetic signals to the input(s) of the device.

20 Claims, 9 Drawing Sheets

(51) Int. Cl.

*G01R 33/32* (2006.01)
*H01P 3/08* (2006.01)
*H10N 50/20* (2023.01)

(58) Field of Classification Search

USPC .............................. 324/300, 244.1, 253, 324
See application file for complete search history.

(56) References Cited

U.S. PATENT DOCUMENTS

| | | | | |
|---|---|---|---|---|
| 2015/0042420 A1* | 2/2015 | Toonen | .................... | H01P 3/081<br>977/932 |
| 2015/0192532 A1* | 7/2015 | Clevenson | ........... | G01N 24/006<br>324/304 |
| 2017/0212187 A1* | 7/2017 | Hahn | .................... | G01R 33/032 |

OTHER PUBLICATIONS

Braje "Bringing Quantum Sensors to Fruition" Atomic Physics Gordon Research Conference 2023, 49 pages.
Braje "Solid State Quantum Sensors from Materials to Applications" MIT Presentation Jun. 19, 2023, 44 pages.
DeQuilettes, "Diamond Engineering to Enable Future Quantum Technologies" MIT Presenation Feb. 21, 2023, 62 pages.
Eisenach et al., "Broadband loop gap resonator for nitrogen vacancy centers in diamond", Review of Scientific Instruments 89, 094705 (2018) https://doi.org/10.1063/1.5037465, 11 pages.
Horsley et al. "Microwave device characterization using a widefield diamond microscope." Physical Review Applied 10.4 (2018): 044039, 10 pages.
Kapitanova et al. "3D uniform manipulation of NV centers in diamond using a dielectric resonator antenna." JETP Letters 108 (2018): 588-595, 8 pages.
Mariani et al. "System for the remote control and imaging of MW fields for spin manipulation in NV centers in diamond." Scientific Reports 10.1 (2020): 4813, 10 pages.
Opaluch et al. "Optimized planar microwave antenna for nitrogen vacancy center based sensing applications." Nanomaterials 11.8 (2021): 2108, 13 pages.
Sasaki et al., "Broadband, large-area microwave antenna for optically detected magnetic resonance of nitrogen-vacancy centers in diamond." Review of Scientific Instruments 87.5 (2016), 6 pages.
Schloss "Quantum Sensing with a Diamond Magnetic Microscope" MIT Presentation, MITRE-MITLL Technical Exchange, Apr. 7, 2023, 20 pages.
Schloss "Quantum Sensing with a Diamond Magnetic Microscope" Presented to the MIT Industrial Liaison Program and Technology Licensing Office Feb. 10, 2023, 15 pages.
Schloss, "Engineering Diamond for Quantum Sensing," AVS Quantum Science Workshop, Jan. 19, 2023, 38 slides.
Yang et al., "Microstrip-line resonator with broadband, circularly polarized, uniform microwave field for nitrogen vacancy center ensembles in diamond." AIP Advances 9.7 (2019), 7 pages.
Yaroshenko et al., "Circularly polarized microwave antenna for nitrogen vacancy centers in diamond." Review of Scientific Instruments 91.3 (2020), 10 pages.

* cited by examiner

INTEGRATED ELECTROMAGNETIC CONTROL AND SHIELDING OF SOLID-STATE SPIN ENSEMBLES

CROSS-REFERENCE TO RELATED APPLICATION(S)

This application claims the priority benefit, under 35 U.S.C. 119(e), of U.S. Application No. 63/480,630, filed Jan. 19, 2023, which is incorporated herein by reference in its entirety for all purposes.

STATEMENT OF GOVERNMENT RIGHTS

This invention was made with government support under FA8702-15-D-0001 awarded by the U.S. Air Force, and FA8721-19-F-0001 awarded by the Defense Advanced Research Projects Agency. The government has certain rights in the invention.

BACKGROUND

Solid-state quantum devices for sensing, networking, or computing leverage spin degrees of freedom housed within crystalline hosts. One example is the nitrogen-vacancy (NV) center in diamond. The NV center is an atomic-scale spin defect that can operate as a robust magnetic field sensor with high sensitivity and resolution. One method of sensing magnetic fields with NV centers uses an optically detected magnetic resonance (ODMR) spectrum to determine the NV ground-state transition frequencies, which experience Zeeman splitting as a function of the applied magnetic field and are scaled only by fundamental constants.

SUMMARY

Control of NV centers and other spin systems for magnetometry and other sensing, networking, and computing applications relies on precisely targeted electromagnetic fields. Most sensing protocols using NV centers use near-resonant electromagnetic fields to drive transitions between or among the NV quantum spin states. For sensors that leverage ensembles of spin defects for improved sensitivity or wide-field imaging, the control fields should be sufficiently strong and uniform across the ensemble's spatial extents.

Fortunately, the magnetic control field in a solid-state spin sensor can be made stronger and more uniform with a metallized solid-state host in a metallized interposer. The solid-state host contains a solid-state spin ensemble and is metallized with a first conductive layer (e.g., a metal layer) on a first face and a second, at least partially transparent conductive layer on a second face opposite the first face. The interposer is made of a dielectric substrate with a ground plane on one side and one or more microwave transmission lines on the opposite side. The solid-state host fits into an opening in the dielectric layer such that its first conductive layer forms part of the ground plane and the microwave transmission lines are in electrical communication with the second (at least partially transparent) conductive layer. In operation, the microwave transmission lines guide a microwave signal that produces a uniform alternating current (AC) magnetic field across the solid-state spin ensemble, e.g., for an optically detected magnetic resonance (ODMR) measurement of an external magnetic field.

Such an interposer and sensor can be implemented, for example, as an apparatus that includes a solid-state host (e.g., diamond) containing a solid-state spin ensemble (e.g., nitrogen vacancy centers) and a dielectric substrate (e.g., made of aluminum nitride, silicon carbide, and/or ceramic) having an opening therein to receive the solid-state host. The solid-state host has first and second conductive layers on opposite faces, with the second conductive layer being at least partially transparent to fluorescence emitted by the solid-state spin ensemble. There is a ground plane disposed on a first side of the dielectric substrate in electrical communication with the first conductive layer and a microwave transmission line disposed on a second side of the dielectric substrate in electrical communication with the second conductive layer. In operation, the microwave transmission line guides a microwave signal that produces a uniform alternating-current (AC) magnetic field across the solid-state spin ensemble.

The solid-state host, the first conductive layer, and the second conductive layer can form a shunt capacitor in a microwave transmission network formed at least in part by the ground plane and the microwave transmission line.

The dielectric substrate may be substantially planar or may have a pyramidal feature or other protrusion with the opening at an apex of the pyramidal feature. The dielectric substrate can have chamfered edges defining the opening to expose at least a portion of a side facet of the solid-state host.

The microwave transmission line may be a first microwave transmission line, in which case there may be a second microwave transmission line disposed on the second side of the dielectric substrate in electrical communication with the second conductive layer and configured to guide a phase-shifted version of the microwave signal. The microwave transmission line can include a meander section.

The apparatus may also include a microwave signal generator, operably coupled to the microwave transmission line, to generate the microwave signal. It can also include a laser, in optical communication with the second conductive layer, to illuminate the solid-state spin ensemble, e.g., through a side facet of the solid-state host. And it can include a detector, in optical communication with the second conductive layer, to detect fluorescence emitted by the solid-state spin ensemble through the second conductive layer.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. The terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar components).

DETAILED DESCRIPTION

Figure 1:
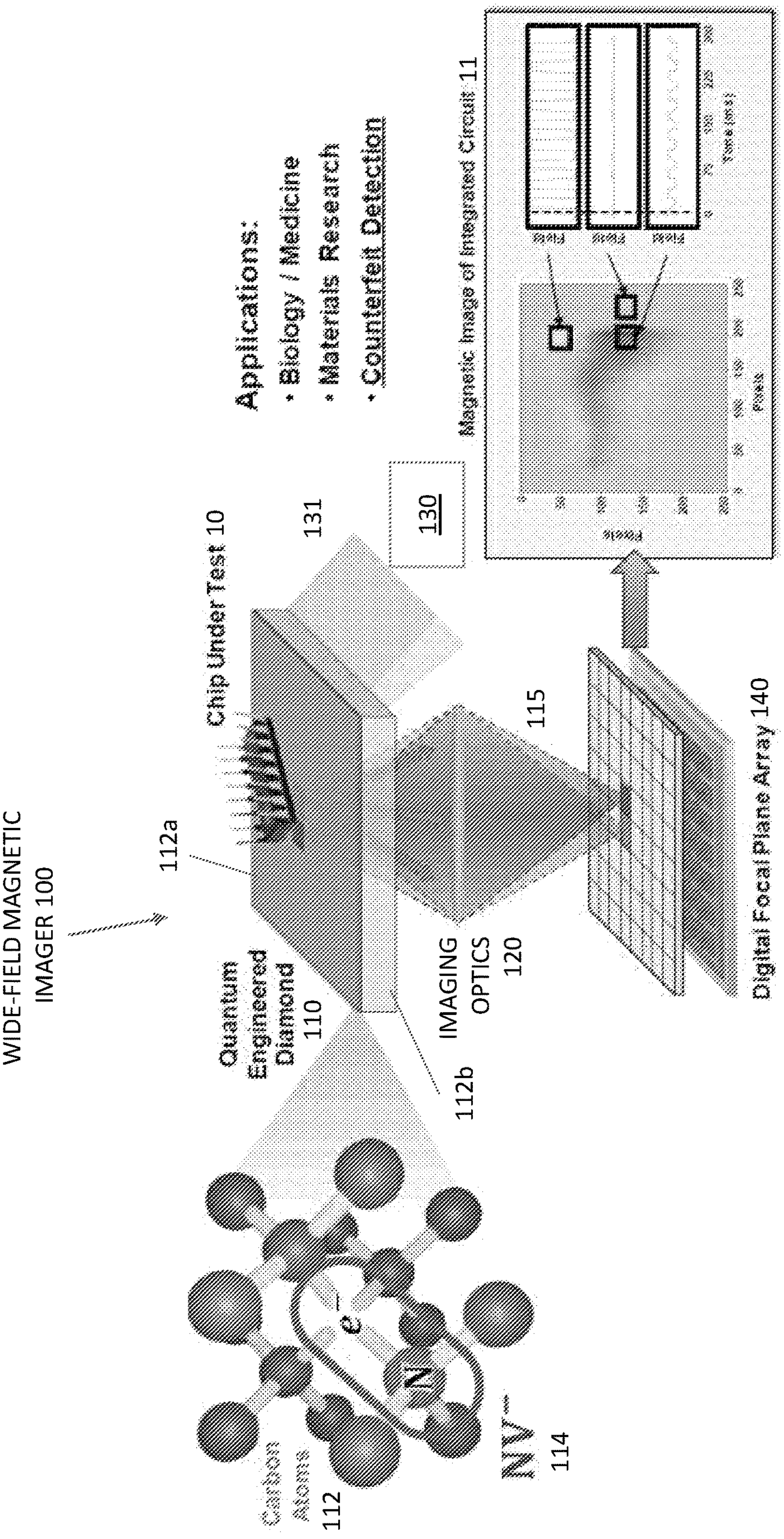
FIG. 1 illustrates a wide-field magnetic imager using a thin, metallized solid-state host (e.g., a diamond slab) that contains an ensemble of spins (e.g., nitrogen vacancies) for magnetic imaging.

Solid-state spin sensors use spins in solid-state (e.g., crystal) hosts, such as nitrogen vacancies (NVs) in diamond, to sense magnetic fields, electric fields, temperature, and/or pressure. For example, NVs can sense applied magnetic fields using optically detected magnetic resonance (ODMR) measurements. In an ODMR measurement, an ensemble of NVs or other spins absorbs optical and microwave energy in order to transition between energy levels, while simultaneously emitting photoluminescence. The intensity of emitted light can be used to identify the spin ensemble's average spin state, which depends on the magnetic field experienced by the spins in the spin ensemble.

One challenge with making measurements using a spin ensemble is subjecting the spin ensemble to a uniform microwave field. The inventors have recognized that this challenge can be addressed by using the solid-state host that contains the ensemble (e.g., a diamond that contains NV centers) as (at least part of) the dielectric layer in a parallel plate capacitor that delivers a more uniform microwave magnetic field to the spin ensemble. This solid-state host can be formed into a thin, rectangular prism; for convenience, the bases of the rectangular prism are called the top and bottom here, though these names should not be taken as limiting the orientation of the spin sensor or the solid-state host. The top is coated with a thin layer of metal or another conductor (e.g., a 100 nm thick layer of copper) and the bottom is coated with a conductive layer that is at least partially transparent (e.g., roughly 80% optically transparent) at the pump and fluorescence wavelengths for ODMR measurement. The metallized solid-state host is inserted into a hole in an interposer that is roughly as thick as the metallized solid-state host.

The interposer is an electrical interface that routes microwave energy between a microwave signal generator and the spin ensemble in the solid-state host. It includes a layer of dielectric material, such as aluminum nitride, with a hole to accommodate the solid-state host. One side (e.g., the top) of this dielectric layer, or dielectric substrate, is coated with a thin layer of metal or another conductor that forms a ground plane with the metal layer on the top of the solid-state host when the solid-state host is fitted into the hole. The opposite side (e.g., the bottom) of the dielectric layer is patterned with microwave transmission lines (e.g., microstrips) that couple a microwave signal to opposite lateral edges (e.g., the left and right sides) of the 80% optically transparent conductive coating on the bottom of the solid-state host. The microwave transmission lines can be coupled to a single microwave connector, such as a micro-miniature coaxial connector, in which case they can be shaped or patterned (e.g., in a meander pattern) such that they are 180 degrees out-of-phase with each other at the center frequency of the microwave signal. The microwave signal generates a (substantially) uniform magnetic field across (substantially) the entire solid-state host with field lines oriented parallel to the top and bottom of the solid-state host.

For an ODMR measurement, the spin ensemble can be illuminated by a laser with a laser beam via the (e.g., 80%) optically transparent conductive coating on the bottom of the solid-state host. The optically transparent conductive coating can also transmit photoluminescence from the spin ensemble to a detector or detector array, such as charge-couple device (CCD) or complementary metal-oxide-semiconductor (CMOS) array.

The interposer can be substantially flat/planar. Alternatively, it may be shaped to have a pyramidal indentation on the bottom and a corresponding pyramidal protrusion on the top, with the hole for the solid-state host at the apex of the protrusion. This pyramidal deformation allows the top of the solid-state host and the spin ensemble contained in the solid-state host to be placed closer to the object being measured (device under test).

The interposers and metallized solid-state hosts disclosed here deliver highly uniform, strong electromagnetic fields to an ensemble of spin defects (e.g., NVs in diamond) with high performance across an arbitrary range of electromagnetic field frequencies limited by choice of implementation. Limitations include stability of relative permittivity over frequency for a given substrate; operational frequency range of the connectors and cables used to couple electromagnetics signals generated by the signal source(s); conductor thickness; and manufacturing tolerances. Integrating the crystal host into the transmission line circuit ensures that the applied magnetic field is uniform and that the magnitude of the applied field is largest inside the crystal host.

The use of a high-thermal-conductivity dielectric material (e.g., aluminum nitride, silicon carbide, ceramics, etc.) in the interposer's dielectric substrate enables the interposer to act as a heat spreader, which mitigates heating effects from absorption of optical photons used for initialization and readout of the spin states.

For sensing applications, the uniform ground plane incorporating both the dielectric layer and the spin-containing crystal provides shielding, reducing or avoiding crosstalk between the control electromagnetic fields with nearby samples or systems generating signals of interest.

Solid-state spin sensors and sensing systems made with inventive interposers have several advantages over other solid-state spin sensors and sensing systems. First, an inventive interposer allows a test article or device under test to be positioned very close to (e.g., within 10 microns of) the active region of the solid-state spin ensemble thanks to mechanical standoffs incorporated into the structure of the interposer.

Second, an inventive interposer can reduce or eliminate electromagnetic interference to/from the solid-state spin sensor from/to the test article(s). The electromagnetic interference can be tuned by adjusting the thickness of metal deposited on the crystalline (solid-state) host.

Third, an inventive interposer produces highly uniform electromagnetic fields within the active region of the solid-state spin ensemble in a smaller volume than other approaches, including shorted loops, dielectric resonators, "omega" loops, co-planar waveguides, microstrips, and printed circuit board (PCB) antennas. Neglecting connectors used to couple electromagnetic signals to the structure, the interposer's volume can be reduced to a region approaching that of the crystal host.

Fourth, an inventive interposer provides precise amplitude and phase control of the applied electromagnetic signal (s) within the active region of the solid-state spin ensemble. Typically, the precision is limited only by the electromagnetic signal source (e.g., a microwave signal generator coupled to the interposer).

Fifth, the material-dependent heat-spreading efficiency of the interposer's dielectric substrate thermally stabilizes the solid-state spin ensemble. The interposer's substrate may be made of any electrically insulating material sufficient for use with electromagnetic transmission lines. Electrically insulating substrates with high thermal conductivity such as aluminum nitride, silicon carbide, and diamond can be selected for maximal heat spreading efficiency without a significant re-design of the electromagnetic transmission line network. For applications that benefit from dielectric substrates with high thermal conductivity, such as aluminum nitride or silicon carbide, and/or complex geometries, machining may involve costly, specialized equipment. For these applications, low-volume production may be prohibitively expensive. To mitigate this, design modifications to improve manufacturability using standard computer numerical control (CNC) or additive manufacturing equipment can be made. For example, the interposer could be a multi-part structure rather than a monolithic structure.

Wide-Field Magnetic Field Imaging

FIG. 1 illustrates a wide-field magnetic imager 100 that uses a solid-state host doped with spins, such as a quantum engineered diamond 110, to make ODMR measurements of a device under test (DUT) 10, such as an integrated circuit chip. The quantum engineered diamond 110 is a thin slab of diamond that contains an ensemble of nitrogen vacancy ($NV^-$) centers 114 in a lattice of carbon atoms 114. The quantum engineered diamond 110 can have a thickness of microns to millimeters to centimeter, depending on the diamond growth method, with NV-doped regions or layers that range from nanometer-scale to the full slab thickness. The lateral dimensions of the quantum engineered diamond 110 can range from millimeters to centimeters (e.g., 1-5 mm by 1-5 mm). Other solid-state hosts and spins include silicon vacancy and divacancy centers in diamond, tin vacancy centers in diamond, lead vacancy centers in diamond, silicon vacancies and other defects in silicon carbide, and boron vacancy centers in in hexagonal boron nitride.

One face of the quantum engineered diamond 110 is coated with a metal layer 112*a* (e.g., a layer of gold or copper) and the opposite face is coated with a fully or partially transparent conductive layer 112*b* (e.g., a layer of indium tin oxide (ITO) or another transparent conductor). The quantum engineered diamond 110 can be held in place with an interposer like those illustrated in FIGS. 2-6 and described below.

The metal layer 112*a* can be made of material with a relative permeability near unity (they should be non-magnetic), e.g., gold, which prevents oxidation. A thin (e.g., ~5 nanometer thick) adhesion layer (e.g., titanium or chromium) may be applied between the diamond and the metal layer 112*a* to create a stronger interfacial bond between the diamond and the layer metal layer 112*a*. The metal layer 112*a* can be as thin as tens of nanometers and as thick as many microns (e.g., 1-10 microns). Titanium or chromium adhesion layers can be as thin as a few nanometers (e.g., 1-10 nm) but also can be much thicker (50 nm or 100 nm). The thickness of the metal layer 112*a* can be chosen based on application: a thicker layer will provide more electromagnetic interference shielding of the applied AC signal but may also shield the field(s) being sensed. The thickness also depends on operating frequency: for sensing high-frequency signals, the total layer thickness should be roughly 50-100 nanometers; whereas, for low-frequency signals, the total layer thickness can be 100-500 nm or more.

The (partially) transparent conductive layer 112*b* can also range in thickness from tens of nanometers and many microns (e.g., 1-10 microns), depending on the application, desired transparency, fluorescence contrast, etc. The transparent conductive layer 112*b* can be made completely of transparent conductive material, such as ITO, or a combination of materials, such as an ITO-metal-ITO stack. For example, the transparent conductive layer 112*b* can include a 50 nm layer of ITO, 2-4 nm of silver or gold, and another 50 nm layer of ITO. At this total thickness of about 100 nm, the ITO-metal-ITO has an optical transparency at the fluorescence wavelength of around 80% and a surface resistivity of less than 10 ohms per square.

In operation, the $NV^-$ centers 114 are placed in a predetermined quantum mechanical state with a combination of an AC magnetic field generated with microwave radiation applied to metal layer 112*a*, (partially) transparent conductive layer 112*b*, and interposer (not shown) and optical radiation or pump beam 131 from a laser 130. The optical radiation 131 illuminates the NV$^-$ centers 114 either through the (partially) transparent conductive layer 112*b* or through one of the side facets of the quantum engineered diamond 110 as shown in FIG. 1. If the incidence angle is shallow enough and the refractive index of the surrounding medium is low enough, the pump beam 131 may totally internally reflect off the face of the quantum engineered diamond 110 that is coated with the metal layer 112*a* and propagate out the far side of the quantum engineered diamond 110. The pump beam 131 can also reflect off the metal layer 112*a* and propagate back through the quantum engineered diamond 110. Reflection increases the interaction length between the pump beam 131 and the NV$^-$ centers 114, increasing the signal-to-noise ratio and improving the sensitivity of the magnetic field measurement.

The NV$^-$ centers 114 emit fluorescence 115 isotropically in response to the microwave and optical radiation at frequencies corresponding to the local magnetic field(s) applied by the DUT 10. Some of this fluorescence 115 propagates directly out of the quantum engineered diamond 110 through the (partially) transparent conductive layer 112*b*, and some of it reflects off the metal layer 112*a* and out of the quantum engineered diamond 110 through the (partially) transparent conductive layer 112*b*.

Imaging optics 120 image the fluorescence 115 emitted by the NV$^-$ centers 114 onto a digital focal plane array (DFPA) 140 or another detector array, such as a CMOS or CCD. The DFPA 140 transduces the fluorescence 115 into time-varying electrical signals that represent the magnetic field(s) experienced by the NV$^-$ centers 114. These electrical signals can be used to display a time-varying magnetic image 11 of the DUT 11 as shown at lower right in FIG. 1.

Interposer

FIGS. 2A-2F show an interposer 200 that can hold a solid-state host, such as the quantum engineered diamond 110, in a sensor, such as the wide-field magnetic imager 100 of FIG. 1. The interposer can be modified to accept other crystalline hosts and/or used for other applications, such as spin-defect characterization, quantum networking, or quantum computing. The interposer 200 is made of a sheet or disc of aluminum nitride printed circuit board (PCB) material 202 or another suitable dielectric material whose top is coated with a conductive ground plane 220. (Although the interposer 200 in FIGS. 2A-2F is disc-shaped, other interposers can have other suitable shapes, including regular or irregular polygons, and other dimensions. The shape and dimensions of the substrate may depend on the application.) The PCB material 202 electrically insulates the ground plane 220 from conductive microwave feed lines 222, one of which includes a phase-shifting meander 224, on the bottom of the interposer 200. The microwave feed lines 222 are coupled to a microwave signal generator 150 via a micro-miniature coaxial (MMCX) microwave connector 226 and guide microwave signals from the microwave signal generator 150 to the quantum engineered diamond 110. The phase-shifting meander 224 has a length selected to ensure the signals delivered to the quantum engineered diamond 110 by the microwave feed lines 222 are 180° out of phase with each other.

Figures 2A, 2B, 2C, 2D:
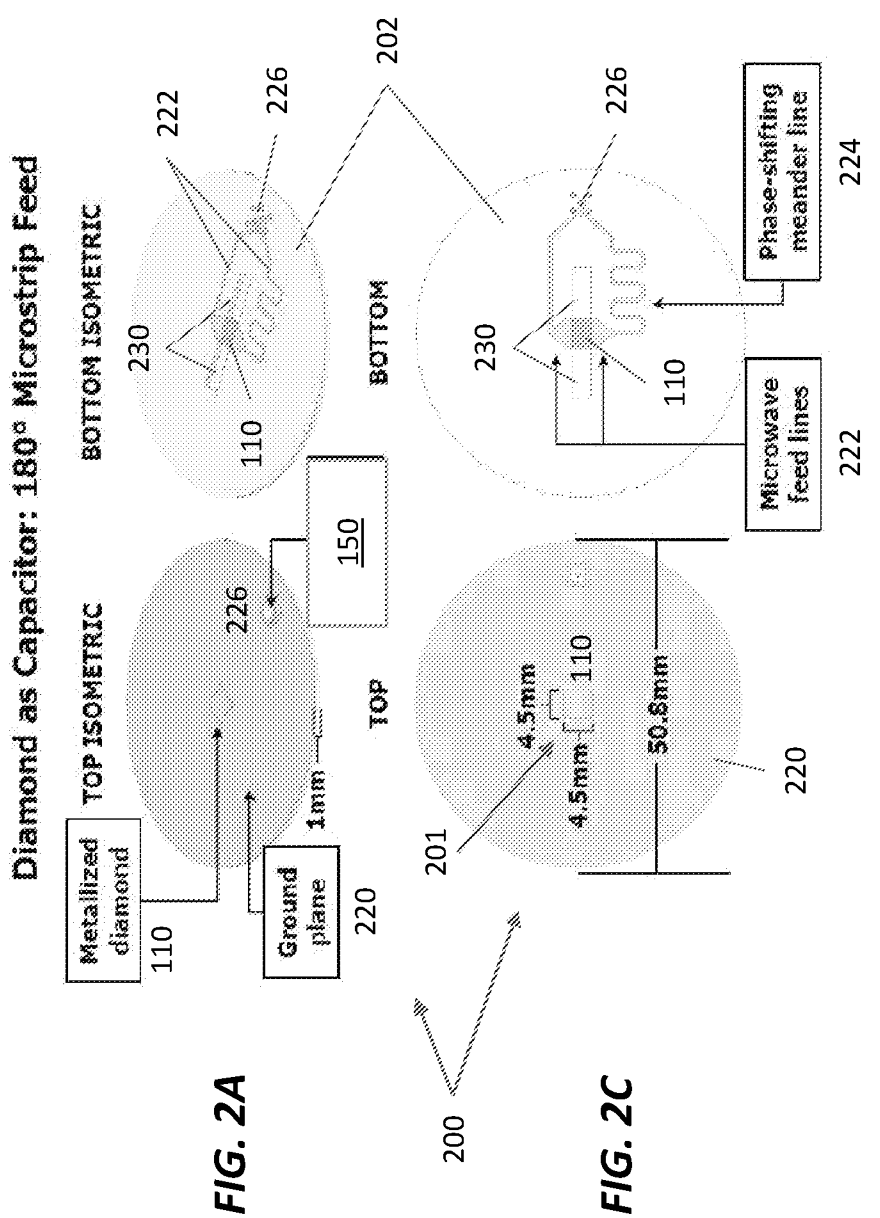
FIG. 2A shows a top isometric view of an interposer that holds a metallized solid-state host, e.g., for magnetic imaging in the wide-field magnetic imager of FIG. 1.
FIG. 2B shows a bottom isometric view of the interposer and metallized solid-state host of FIG. 2A.
FIG. 2C shows a top plan view of the interposer and metallized solid-state host of FIG. 2A.
FIG. 2D shows a bottom plan view of the interposer and metallized solid-state host of FIG. 2A.
Figure 2F:
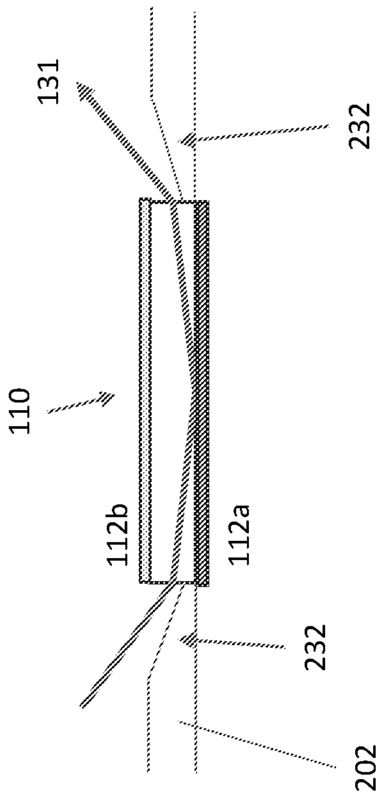
FIG. 2F shows a cross-sectional view of the interposer and metallized solid-state host along the line A-A' in FIG. 2E.
Figure 2E:
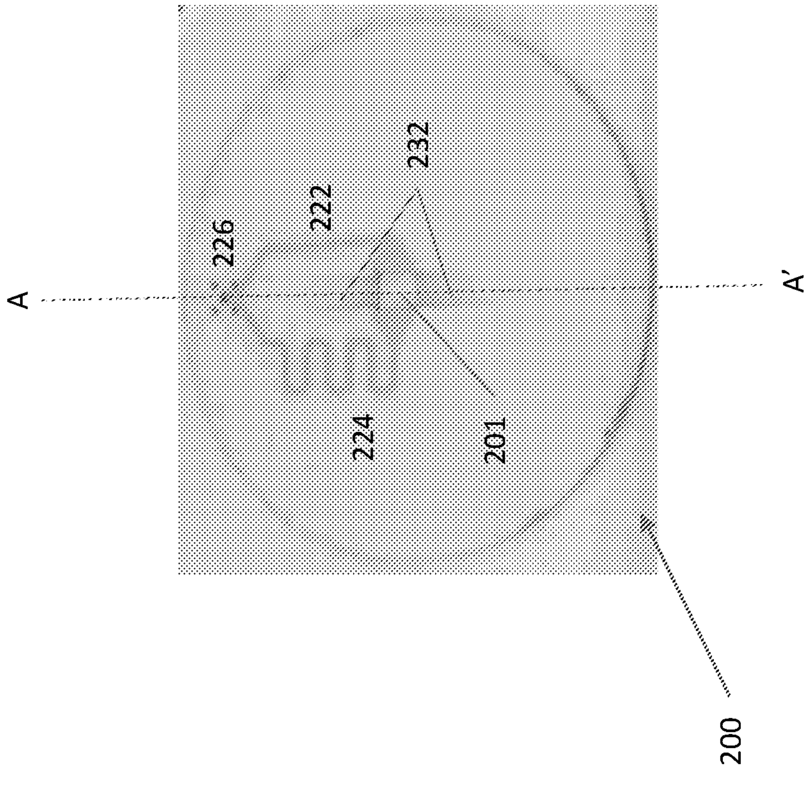
FIG. 2E is a photographic bottom plan view of the interposer and metallized solid-state host of FIG. 2A.

FIGS. 2E and 2F illustrate how the pump beam 131 (FIG. 1) can be coupled into a side facet of the quantum engineered diamond 110 when the quantum engineered diamond 110 is in the hole 201 in the interposer 200. If the microwave feed lines 222 connect to the east and west edges of the hole 201, the north and south edges of the hole 201 are chamfered or partially cut away to form a laser entrance ramp 232. These chamfered edges partially expose two of the quantum engineered diamond's side facets, allowing them to be illuminated with the pump beam 131, which may be focused in one dimension or in the form of a light sheet roughly parallel to the quantum engineered diamond's largest faces. The pump beam 131 can totally internally reflect at the interface between the quantum engineered diamond 110 and the metal layer 112*a* or simply reflect of the metal layer 112*a* as shown in FIG. 2F.

Figure 3:
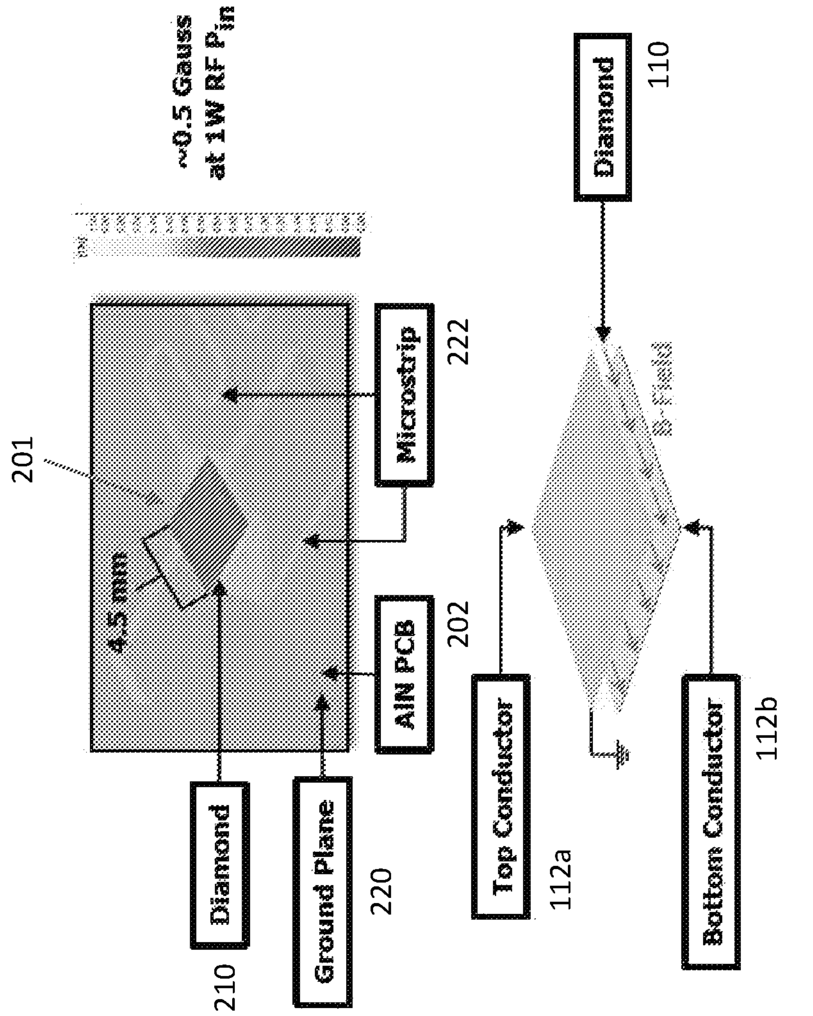
FIG. 3 is a close-up view of the interposer and metallized solid-state host of FIGS. 2A-2D showing how the metallized solid-state slab acts as a capacitor.

FIG. 3 shows how the quantum engineered diamond 110 fits (snugly) into a hole 201 in the interposer 200. The hole's dimensions should match the dimensions of the quantum engineered diamond 110 and can range from millimeters to centimeters laterally, e.g., 1-5 mm to 1-5 mm. Generally, the hole 201 should be sized to hold the quantum engineered diamond 110 securely while providing a large optical aperture for illuminating the quantum engineered diamond 110 with an optical pump beam and collecting fluorescence emitted by the quantum engineered diamond 110.

The metal layer 112*a* is electrically coupled to the ground plane 220, e.g., with a jumper made of metallic foil (not shown). The foil can be made of gold leaf, indium, or copper and have a thickness equal to or less than the height at which the diamond protrudes above the ground plane 220. The foil bridges the gap between the quantum engineered diamond 110 and the ground plane 220, with electrical contact made through physical contact between the ground plane 220, the foil, and the metallic layer 112*a* on top of the quantum engineered diamond 110. If desired, the edges of the face of the quantum engineered diamond 110 nearest the ground plane 220 can be chamfered to prevent the foil from extending beyond the height of the quantum engineered diamond 110.

The (partially) transparent conductive layer 112*b* is electrically coupled to the microwave feed lines 222, with the microwave feed lines 222 attached to opposite edges of the transparent conductive layer 112*b*, e.g., with metallic foil jumpers (not shown).

Figure 4A:
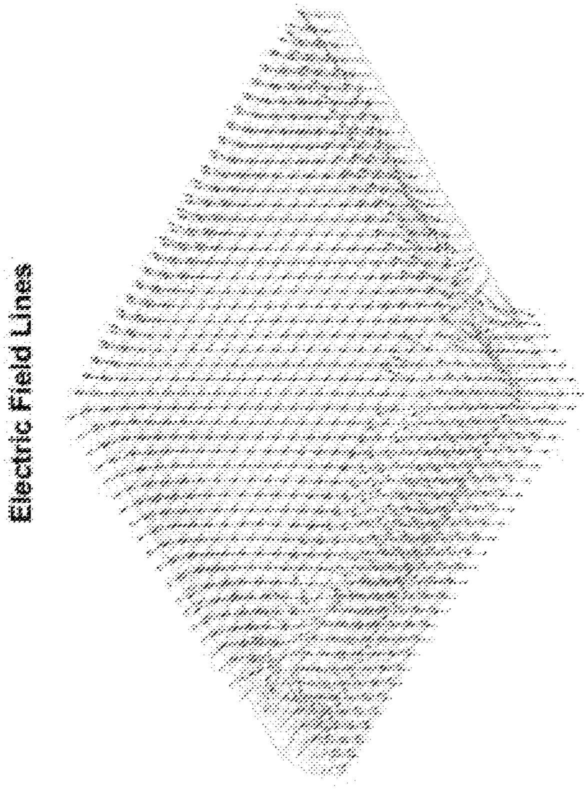
FIG. 4A shows the uniform electric field lines experienced by the spin ensemble in the metallized solid-state host of FIGS. 2A-2D.
Figure 4B:
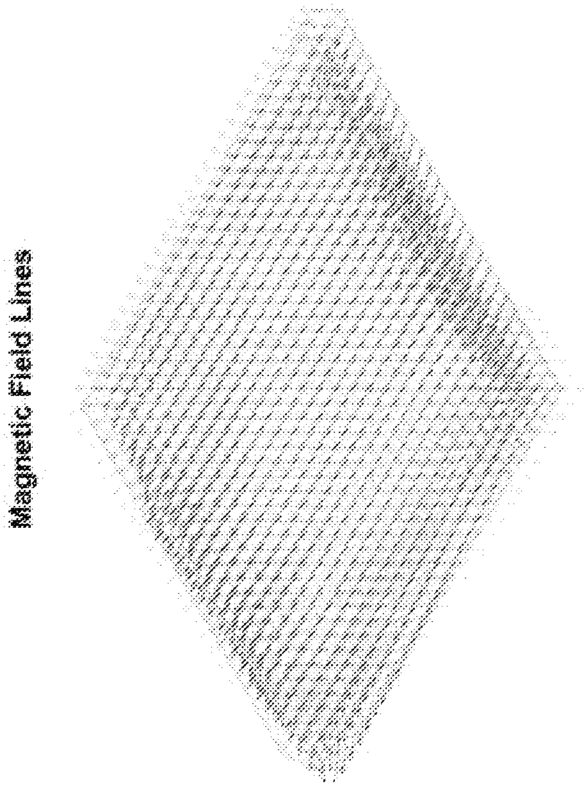
FIG. 4B shows the uniform magnetic field lines experienced by the spin ensemble in the metallized solid-state host of FIGS. 2A-2D.

When connected to the ground plane 220 and microwave feed lines 222, the quantum engineered diamond 110 acts as a shunt capacitor in a microwave transmission line network that includes the microwave feed lines 222. Transmitting a microwave signal through this microwave transmission line network generates an alternating current (AC) electric field normal to the metal layer 112*a* and transparent conductive layer 112*b* and an AC magnetic field parallel to the metal layer 112*a* and transparent conductive layer 112*b* as shown in FIGS. 4A and 4B. The frequency of the microwave signal can vary from sub-MHz to tens or even hundreds of GHz (e.g., 2-4 GHz).

The size and shape of the quantum engineered diamond 110 are selected so that the quantum engineered diamond 110 is not resonant at the microwave frequencies of interest to prevent power dissipation and electromagnetic radiation. Splitting the microwave transmission line into two opposing microwave feed lines 222 that are 180° out-of-phase with each at the center frequency of operation enhances the uniformity of the AC magnetic field applied to the NV centers 114.

Interposer with a Pyramidal Feature

FIGS. 5A-5I show different views of an interposer 500 featuring a rectangular pyramidal feature 530 with a hole 501 at its apex for receiving a metallized solid-state prism or slab containing a spin ensemble (e.g., the quantum engineered diamond 110 shown in FIGS. 1-3). (Other interposers may have features/protrusions in other shapes, such as hemispheres, polyhedral, cylinders, etc.) The interposer 500 can be marked with fiducials 504 for alignment during machining and metal patterning. The shapes and/or locations of the fiducials 504 are typically a matter of preference for the fabricators.

Like the interposer 200 shown in FIGS. 2A-2F, the interposer 500 in FIGS. 5A-5I is a disc of PCB material 502 (e.g., Shapal Hi M Soft™ aluminum nitride ceramic) with a conductive (e.g., copper) ground plane 520 on one side and microwave or radio-frequency (RF) microwave transmission lines or signal traces 522 on the other side. Each signal trace 522 connects at one end to a corresponding microwave connector 526, e.g., a non-magnetic MMCX connector, and at the other end to the quantum engineered diamond in the hole 501, e.g., via a metal foil jumper (not shown) that bridges any gap between the edge of the quantum engineered diamond and the interposer 500. Again, when the quantum engineered diamond is in the hole 501 and electrically connected to the ground plane 520 and signal traces 522, it acts as a shunt capacitor in a microwave transmission line network. Coupling a microwave signal into this microwave transmission line network generates uniform AC electric and magnetic fields perpendicular and parallel to, respectively, the ground plane 520.

Figures 5A, 5B, 5C, 5D:
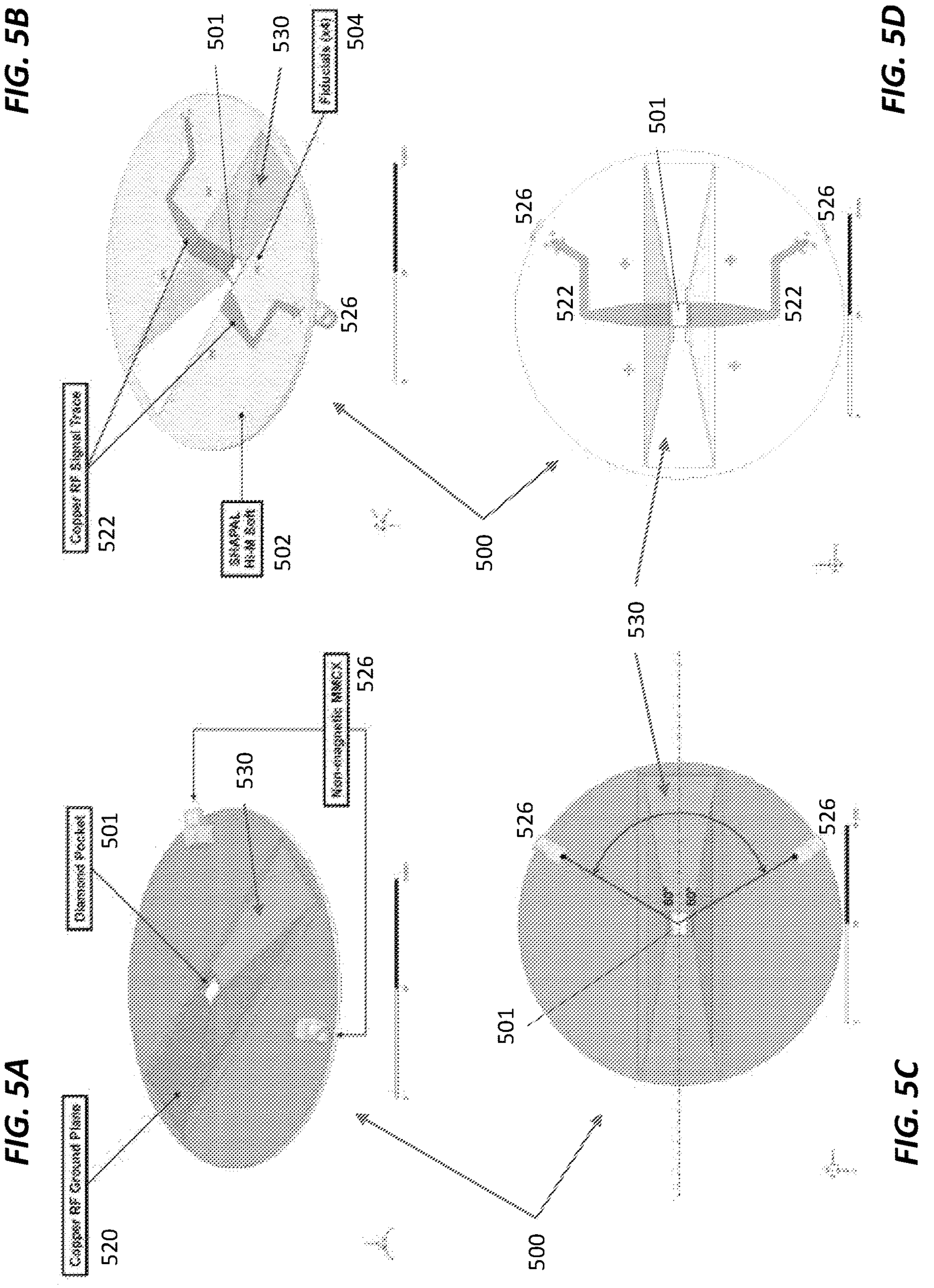
FIG. 5A shows a top isometric view of an interposer that holds a metallized solid-state host at the apex of a pyramidal feature for magnetic imaging and/or other magnetic sensing applications.
FIG. 5B shows a bottom isometric view of the interposer of FIG. 5A.
FIG. 5C shows a top plan view of the interposer of FIG. 5A.
FIG. 5D shows a bottom plan view of the interposer of FIG. 5A.
Figure 5E:
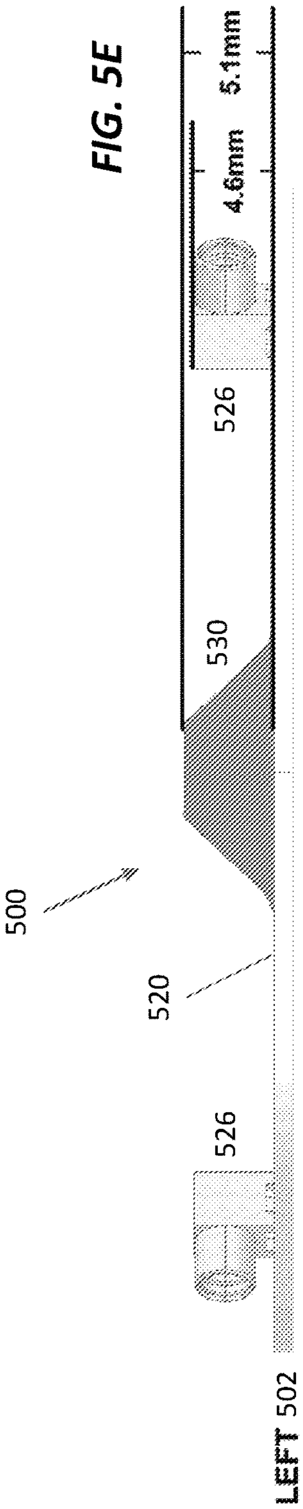
FIG. 5E shows a first elevation view of the interposer of FIG. 5A.
Figure 5F:
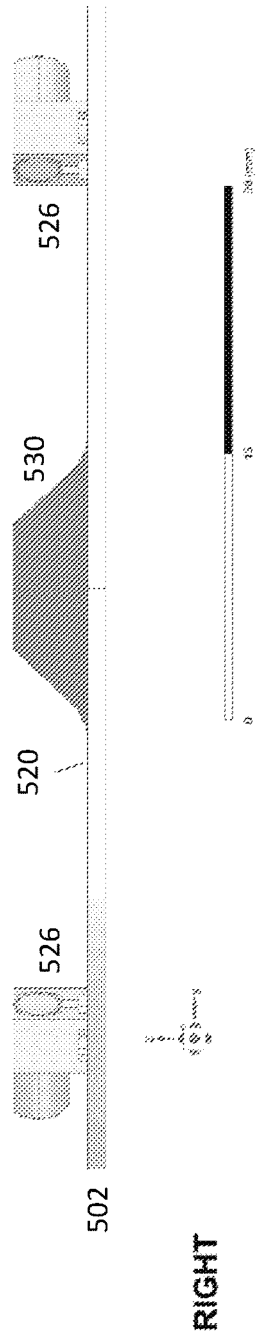
FIG. 5F shows a second elevation view of the interposer of FIG. 5A.
Figure 5G:
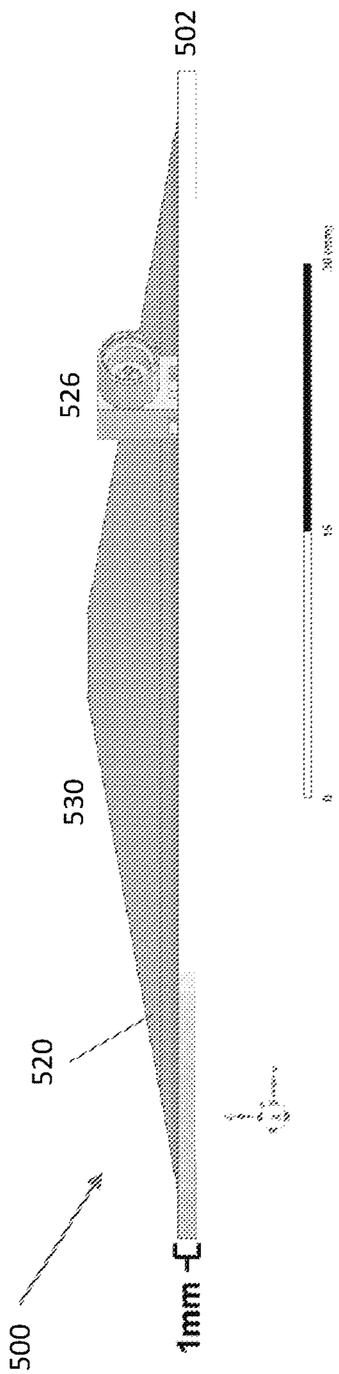
FIG. 5G shows a third elevation view of the interposer of FIG. 5A.

The pyramidal feature 530 forms a protrusion on the top of the interposer 500 and a recess or concavity on the bottom of the interposer. The protrusion makes it possible to place the metal-layer-side of the quantum engineered diamond closer to the DUT (not shown). In fact, FIGS. 5E-5G show that the top side of the pyramidal feature 530 is slightly taller than the microwave connectors 526 (5.1 mm versus 4.6 mm), meaning that the pyramidal feature 530 (and hence the quantum engineered diamond at its apex) can be scanned back and forth much like the tip of a scanning tunneling electron microscope without interference or constraints from the microwave connectors 526. Other connectors and other locations for the connectors are also possible so long as the connections can operate at the AC frequencies dictated by the spin defects.

Figure 5H:
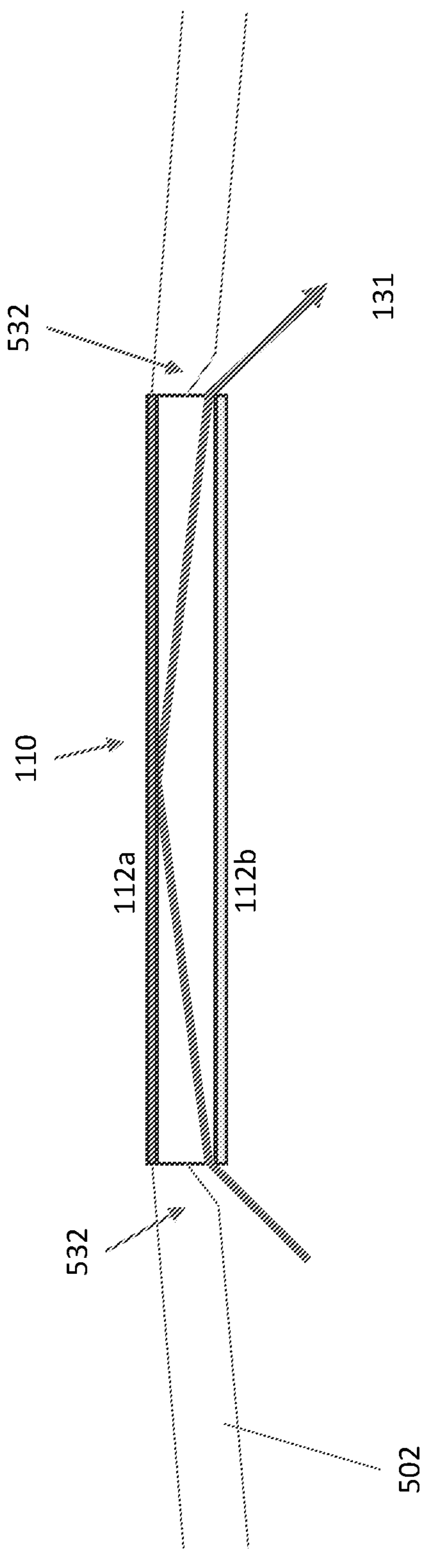
FIG. 5H shows a cross-sectional elevation view of the interposer of FIG. 5A.
Figure 5I:
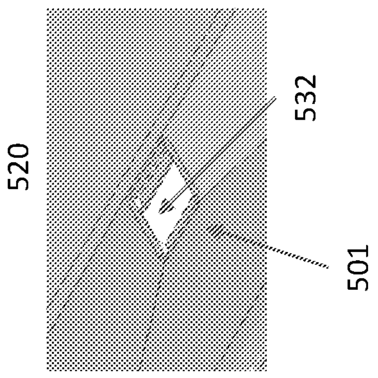
FIG. 5I shows a close-up of the opening in the top isometric view of FIG. 5A.

The recess or concavity forms a shallow slanted channel for the optical radiation (pump beam) used to excite the spins in the metallized solid-state prism. The edges 532 of the hole 501 that border the channel can be chamfered or beveled to expose portions of the side facets of the quantum engineered diamond 110 as shown in FIG. 5H. These chamfered edges 532 allow the pump beam 131 to illuminate the exposed portions of the side facets of the quantum engineered diamond 110 at an angle of incidence that can range from close to normal incidence to the critical angle for total internal reflection (e.g., about 24° in diamond). Generally, shallower incidence angles lead to longer interaction lengths between the pump beam 131 and the spins, making better use of the available laser power for wide-field imaging and other applications. Steeper angles, including normal incidence, are also possible but may lead to shorter interaction lengths.

Figures 6A, 6B, 6C:
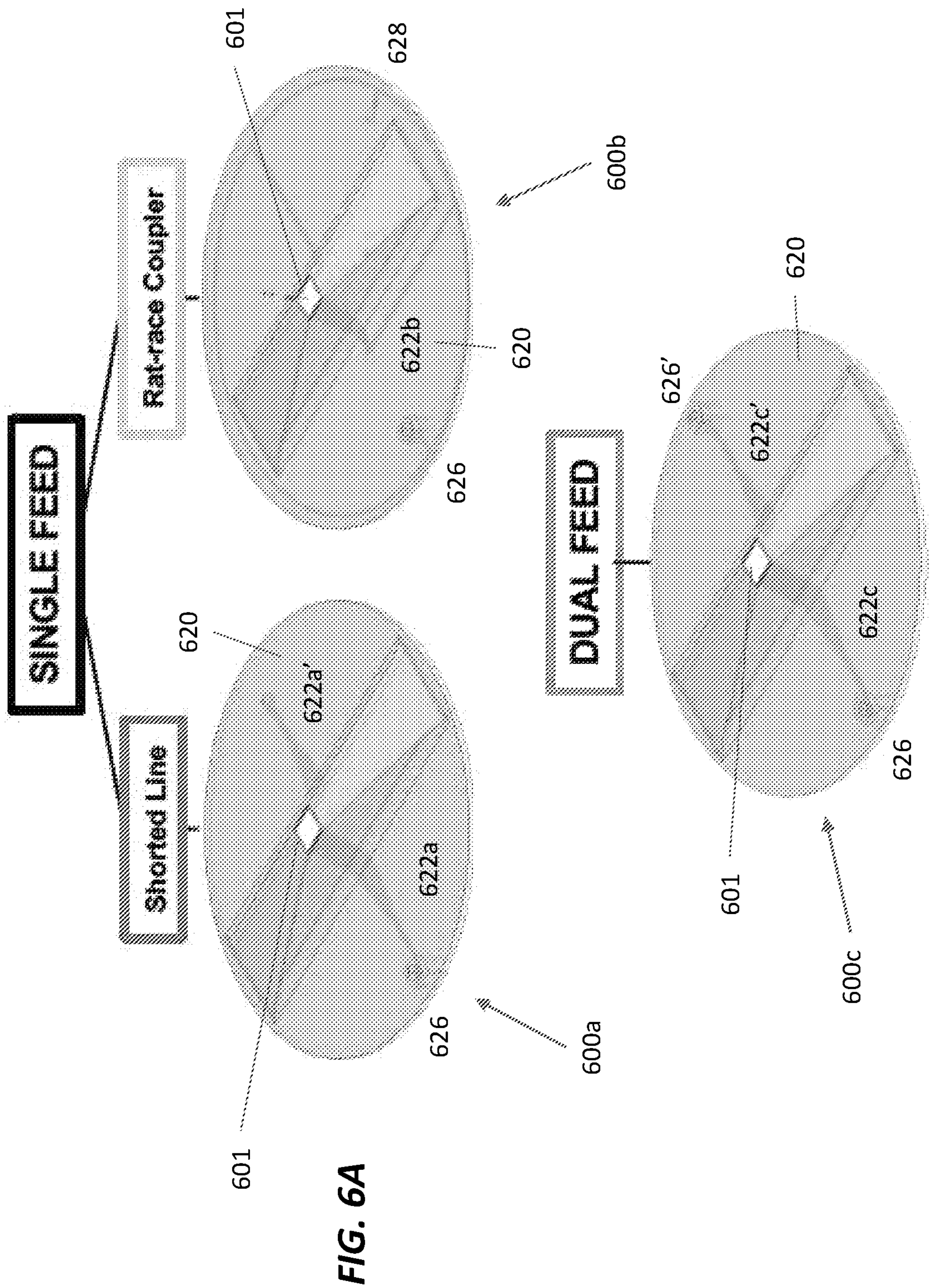
FIG. 6A shows a top isometric view of an interposer that holds a metallized solid-state host at the apex of a pyramidal feature with a single microwave feed using shorted microwave transmission lines.
FIG. 6B shows a top isometric view of an interposer that holds a metallized solid-state host at the apex of a pyramidal feature with a single microwave feed using rat-race microwave coupled transmission lines.
FIG. 6C shows a top isometric view of an interposer that holds a metallized solid-state host at the apex of a pyramidal feature with a dual microwave feed using electrically isolated microwave transmission lines.

FIGS. 6A-6C show top isometric views of interposers 600*a*-600*c* with different microwave feeds. Like the interposer 500 in FIGS. 5A-5I, each of these interposers 600*a*-600*c* is a disc made of PCB material 602 with a pyramidal feature 630, a hole 601 for a metallized solid-state host at the apex of the pyramidal feature 630, and a ground plane 620 on its top. The bottom of each of these interposers 600*a*-600*c* also includes at least one microwave feed line 622*a*-622*c* coupled to at least one microwave connector 626. (The ground planes 620 and PCB material 602 in FIGS. 6A-6C are shown as translucent so these microwave feed lines 622*a*-622*c* and microwave connectors 626 are visible.)

FIG. 6A shows an interposer 600*a* with a microwave feed line 622 that connects one edge or side of the (partially) transparent layer on the metallized solid-state host to the microwave connector. The interposer 600*a* also includes a shorted microwave feed line 622*a*', also called a shorted line, with one end that connects to the other side of the (partially) transparent layer and another end that simply terminates on the bottom of the PCB 602. The shorted line 622*a*' is fairly simple and takes up little space on the bottom of the PCB substrate 602. It is an inductive load and therefore narrowband. It relies on a wave reflected by the termination for a 180° phase shift, resulting in an amplitude taper across the metallized solid-state host due to two-way conductor losses. The tolerances on the feed lines 622*a*, 622*a*' tend to be very tight, and it can be challenging to tune the feed lines 622*a*, 622*a*' after manufacture. In operation, the feed lines 622*a*, 622*a*' can generate a uniform magnetic field across the metallized solid-state host with a field strength of about 0.4 G for a 1 W microwave signal.

FIG. 6B shows an interposer 622*b* with a rat-race coupler 622*b*, also called a hybrid ring coupler. The rat-race coupler 622*b* is a 180° hybrid coupler that can operate over a broad bandwidth. It includes a trace that transits substantially the entire circumference of PCB substrate 602, with fixed branch-line locations laid out with tight tolerances and a load one branch. The rat-rate coupler 622*b* has four ports: a first port connected to the MMCX connector 626, second and third ports connected to the diamond (not shown), and a fourth port (shorting pin 628) near an edge of the interposer 622*b*. A meander section phase-matches the branch lines and maintains a 180° phase shift. Tuning may be intractable after manufacture. The rat-race coupler 622*b* can generate a uniform magnetic field across the metallized solid-state host with a field strength of about 0.8 G for a 1 W microwave signal.

FIG. 6C shows an interposer 600*c* with dual-feed microwave transmission lines 622*c* and 622' like those in FIG. 5. These microwave transmission lines 622*c*, 622' can guide ultrawideband microwave signals whose amplitude and relationship is determined off the interposer 600*c*. The dual-feed microwave transmission lines 622*c*, 622' take up slightly more space on the interposer 600*c* than a shorted line but are tunable after manufacture. Most, if not all, of the tuning can be done using impedance-tuning components external to the device. For a single-port device, the reflection phase can be tuned to 0 degrees and the return loss can be increased or maximized since the interposer is intended to be a non-resonant device. For a dual-port device, the return loss and insertion loss can be reduced or minimized and the phase between the ports tuned to 180 degrees. The dual-feed microwave transmission lines 622*c*, 622' can generate a uniform magnetic field across the metallized solid-state host with a field strength of about 0.7 G for a 1 W microwave signal.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the components so conjoined, i.e., components that are conjunctively present in some cases and disjunctively present in other cases. Multiple components listed with "and/or" should be construed in the same fashion, i.e., "one or more" of the components so conjoined. Other components may optionally be present other than the components specifically identified by the "and/or" clause, whether related or unrelated to those components specifically identified. Thus, as a non-limiting example, a reference to "A and/or B", when used in conjunction with open-ended language such as "comprising" can refer, in one embodiment, to A only (optionally including components other than B); in another embodiment, to B only (optionally including components other than A); in yet another embodiment, to both A and B (optionally including other components); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of components, and, optionally, additional unlisted items. Only terms clearly indicated to the contrary, such as "only one of" or "exactly one of," or, when used in the claims, "consisting of," will refer to the inclusion of exactly one component of a number or list of components. In general, the term "or" as used herein shall only be interpreted as indicating exclusive alternatives (i.e., "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more components, should be understood to mean at least one component selected from any one or more of the components in the list of components, but not necessarily including at least one of each and every component specifically listed within the list of components and not excluding any combinations of components in the list of components. This definition also allows that components may optionally be present other than the components specifically identified within the list of components to which the phrase "at least one" refers, whether related or unrelated to those components specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including components other than B); in another embodiment, to at least one, optionally including more than one, B, with no A present (and optionally including components other than A); in yet another embodiment, to at least one, optionally including more than one, A, and at least one, optionally including more than one, B (and optionally including other components); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus comprising:

a solid-state host containing a solid-state spin ensemble;

a first conductive layer on a first face of the solid-state host;

a second conductive layer on a second face of the solid-state host, the second conductive layer being at least partially transparent to fluorescence emitted by the solid-state spin ensemble;

a dielectric substrate having an opening therein to receive the solid-state host;

a ground plane disposed on a first side of the dielectric substrate and in electrical communication with the first conductive layer on the first face of the solid-state host; and a microwave transmission line disposed on a second side of the dielectric substrate in electrical communication with the second conductive layer and configured to guide a microwave signal, the microwave signal producing a uniform alternating-current (AC) magnetic field across the solid-state spin ensemble, wherein the first face and second face of the solid-state host are opposing faces of the solid-state host and the opening receives the solid-state host such that the solid-state host forms part of a microwave transmission network with the ground plane and the microwave transmission line.

2. The apparatus of claim 1, wherein the solid-state host is diamond and the solid-state spin ensemble comprises nitrogen vacancies in the diamond.

3. The apparatus of claim 1, wherein the solid-state host, the first conductive layer, and the second conductive layer form a shunt capacitor in the microwave transmission network.

4. The apparatus of claim 1, wherein the dielectric substrate comprises at least one of aluminum nitride, silicon carbide, or ceramic.

5. The apparatus of claim 1, wherein the dielectric substrate is substantially planar.

6. The apparatus of claim 1, wherein the dielectric substrate includes a pyramidal feature with the opening at an apex of the pyramidal feature.

7. The apparatus of claim 1, wherein the dielectric substrate has chamfered edges defining the opening to expose at least a portion of a side facet of the solid-state host.

8. The apparatus of claim 1, wherein the microwave transmission line is a first microwave transmission line and further comprising a second microwave transmission line disposed on the second side of the dielectric substrate in electrical communication with the second conductive layer and configured to guide a phase-shifted version of the microwave signal.

9. The apparatus of claim 1, wherein the microwave transmission line comprises a meander section.

10. The apparatus of claim 1, further comprising:
a microwave signal generator, operably coupled to the microwave transmission line, to generate the microwave signal.

11. The apparatus of claim 1, further comprising:
a laser, in optical communication with the second conductive layer, to illuminate the solid-state spin ensemble.

12. The apparatus of claim 1, further comprising:
a detector, in optical communication with the second conductive layer, to detect fluorescence emitted by the solid-state spin ensemble through the second conductive layer.

13. A method of conducting an optically detected magnetic resonance (ODMR) measurement with a solid-state host containing a solid-state spin ensemble and having a first face coated with a first conductive layer and a second face opposite the first face coated with a second conductive layer, the second conductive layer being at least partially transparent to fluorescence emitted by the solid-state spin ensemble, the method comprising:
holding the solid-state host in an opening in a dielectric substrate having a ground plane in electrical communication with the first conductive layer on the first face of the solid-state host and a microwave transmission line in electrical communication with the second conductive layer;
applying, via the microwave transmission line, a microwave signal to the second conductive layer, the microwave signal producing a uniform alternating-current (AC) magnetic field across the solid-state spin ensemble;
illuminating the solid-state spin ensemble with optical radiation; and
detecting fluorescence emitted through the second conductive layer,
wherein the first face and second face of the solid-state host are opposing faces of the solid-state host and the opening receives the solid-state host such that the solid-state host forms part of a microwave transmission network with the ground plane and the microwave transmission line.

14. The method of claim 13, wherein the solid-state host is diamond and the solid-state spin ensemble comprises nitrogen vacancies in the diamond.

15. The method of claim 13, wherein the solid-state host, the first conductive layer, and the second conductive layer form a shunt capacitor in the microwave transmission network.

16. The method of claim 13, wherein the dielectric substrate comprises at least one of aluminum nitride, silicon carbide, or ceramic.

17. The method of claim 13, wherein holding the solid-state host in the opening in the dielectric substrate comprises holding the dielectric substrate at an apex of a protrusion in the dielectric substrate.

18. The method of claim 13, wherein illuminating the solid-state spin ensemble with optical radiation comprises coupling the optical radiation into the solid-state host via a side facet of the solid-state host.

19. The method of claim 13, wherein the microwave transmission line is a first microwave transmission line and further comprising:
guiding a phase-shifted copy of the microwave signal to the second conductive layer with a second microwave transmission line.

20. The method of claim 13, further comprising:
shifting a phase of the microwave signal with a meander section in the microwave transmission line.

* * * * *